(12) United States Patent  (10) Patent No.: US 7,022,600 B2
Kim et al.  (45) Date of Patent: Apr. 4, 2006

(54) METHOD OF FORMING DUAL DAMASCENE INTERCONNECTION USING LOW-K DIELECTRIC MATERIAL

(75) Inventors: Jae-Hak Kim, Seoul (KR); Soo-Geun Lee, Suwon-si (KR); Ki-Kwan Park, Busan-si (KR); Kyoung-Woo Lee, Seoul (KR)

(73) Assignee: Samsung Electronics, Co., Ltd., (KR)

( * ) Notice: Subject to any disclaimer, the term of this patent is extended or adjusted under 35 U.S.C. 154(b) by 0 days.

(21) Appl. No.: 10/437,806

(22) Filed: May 14, 2003

(65) Prior Publication Data

US 2004/0067634 A1 Apr. 8, 2004

(30) Foreign Application Priority Data

May 28, 2002 (KR) ............... 10-2002-0029490

(51) Int. Cl.
*H01L 21/475* (2006.01)
(52) U.S. Cl. ............... 438/623; 438/627; 438/638
(58) Field of Classification Search ............. 438/623, 438/627, 638, 643, 687
See application file for complete search history.

(56) References Cited

U.S. PATENT DOCUMENTS

| | | | |
|---|---|---|---|
| 5,753,967 A | 5/1998 | Lin | 257/635 |
| 5,795,823 A | 8/1998 | Avanzino et al. | 438/639 |
| 6,017,817 A | 1/2000 | Chung et al. | 438/637 |
| 6,063,711 A | 5/2000 | Chao et al. | 438/724 |
| 6,077,773 A | 6/2000 | Lin | 438/637 |
| 6,140,226 A * | 10/2000 | Grill et al. | 438/637 |
| 6,153,511 A * | 11/2000 | Watatani | 438/623 |
| 6,300,235 B1 | 10/2001 | Feldner et al. | 438/618 |
| 6,303,489 B1 | 10/2001 | Bass | 438/624 |
| 6,365,504 B1 | 4/2002 | Chien et al. | 438/624 |
| 6,603,204 B1* | 8/2003 | Gates et al. | 257/760 |
| 6,613,666 B1* | 9/2003 | Ma | 438/637 |
| 6,696,222 B1* | 2/2004 | Hsue et al. | 430/313 |
| 6,812,131 B1* | 11/2004 | Kennedy et al. | 438/623 |
| 6,815,331 B1* | 11/2004 | Lee et al. | 438/622 |
| 2002/0025670 A1* | 2/2002 | Miyata | 438/637 |
| 2002/0173143 A1* | 11/2002 | Lee et al. | 438/637 |
| 2003/0008490 A1* | 1/2003 | Xing et al. | 438/622 |
| 2003/0044725 A1 | 3/2003 | Hsue et al. | 430/314 |
| 2003/0119307 A1* | 6/2003 | Bekiaris et al. | 438/638 |

FOREIGN PATENT DOCUMENTS

KR 2000-29195 5/2000

* cited by examiner

*Primary Examiner*—Stephen W. Smoot
(74) *Attorney, Agent, or Firm*—Mills & Onello, LLP

(57) ABSTRACT

In order to avoid a faulty pattern resulting from a photoresist tail being formed due to a step difference of an upper hard mask layer when a dual hard mask layer is used, a planarization layer is formed following patterning of the upper hard mask layer. In this manner, a photoresist pattern is formed without the creation of a photoresist tail. Alternatively, a single hard mask layer and a planarization layer are substituted for the dual lower hard mask layer and an upper hard mask layer, respectively. In this manner, it is therefore possible to form a photoresist pattern without a photoresist tail being formed during photolithographic processes. In order to prevent formation of a facet, the planarization layer is thickly formed or, alternatively, the hard mask layer is etched using the photoresist pattern.

12 Claims, 21 Drawing Sheets

METHOD OF FORMING DUAL DAMASCENE INTERCONNECTION USING LOW-K DIELECTRIC MATERIAL

FIELD OF THE INVENTION

The present invention generally relates to a method of forming a damascene interconnection and, more particularly, to a method of forming the damascene interconnection using a low-k dielectric material.

BACKGROUND OF THE INVENTION

As transistors become more highly integrated, logic devices trend toward high speed and high integration. With high integration of the transistors, interconnections are increasingly minimized in dimension. Such minimization results in interconnection delay and impediment to high speed operation of the devices.

As an interconnection material of a large-scale integrated circuit (LSI), aluminum alloy has been used for many years. At the present time, copper (Cu) has become the most promising substitute for aluminum alloy in that copper enjoys a very low resistivity and has superior electromigration (EM) resistance properties. However, since it is difficult to etch Cu and since Cu is readily oxidized during an oxidation process, a damascene process is used to form Cu interconnections.

The damascene process includes the steps of (1) forming a groove in which an upper interconnection is formed, (2) forming a via hole connecting the upper interconnection to a lower interconnection or a substrate, (3) forming a copper layer over the resultant structure, and (4) planarizing the copper layer by means of a chemical mechanical polishing (CMP). In this manner, the damascene process is a form of filling process.

A low-k dielectric makes it possible to lower the resulting parasitic capacitance between interconnections, enhance device operating speed, and suppress the crosstalk phenomenon. In view of these advantages, the low-k dielectric has been developed in various ways. Generally, the low-k dielectric is classified into a silicon dioxide ($SiO_2$) group organic polymer and a carbon (C) group organic polymer.

In a typical damascene process employing an insulating layer made of organic polymer, a dual hard mask is used because the organic polymer may be damaged by oxygen plasma when a photoresist layer is ashed. In addition, when a rework process is employed wherein a photoresist pattern is removed so as to re-perform the photolithographic process because the initial photolithographic process was incorrect, an insulating layer formed of the organic polymer can become significantly damaged. Accordingly, in the case where an insulating layer formed of organic polymer is used, a dual hard mask is used instead of a single hard mask. That is, a second hard mask operating as a capping layer is formed on the organic polymer insulating layer. The capping layer serves to prevent damage to the organic polymer insulating layer.

A conventional dual damascene process employing a dual hard mask is now described with reference to FIG. 1A through FIG. 1I.

Referring to FIG. 1A, a lower etch-stop layer 105, a lower insulating layer 110, an upper etch-stop layer 115, an upper insulating layer 120, a bottom hard mask layer 125, and a top hard mask layer 130 are sequentially formed on a semiconductor substrate 100.

Referring to FIG. 1B, a photoresist pattern 135 having the opening of a groove pattern is formed on the top hard mask layer 130. Reference symbol "D1" denotes the width of the groove pattern. Using the photoresist pattern 135 as a mask, the top hard mask layer 130 is patterned to form a groove opening 133 exposing a surface of the bottom hard mask layer 125.

Referring to FIG. 1C, the photoresist pattern 135 is removed by ashing. The groove pattern 133 is formed in the top hard mask layer 130.

Referring to FIG. 1D, a photoresist pattern 140 having an opening of the width of an underlying via hole to be formed is provided on the exposed bottom hard mask layer 125. Reference symbol "D2" denotes the width of the hole pattern. Following the photolithographic process for forming the photoresist pattern 140, a photoresist tail 141 may be created due to the lack of a depth of focus (DOF) margin. The lack of the DOF margin is caused by the step difference in the hard mask layer 130. In a subsequent process, the photoresist tail 141 can result in an incorrect pattern, which can prevent the formation of a stable damascene structure. In a worst case scenario, the hole pattern may not be formed.

Referring to FIG. 1E, using the photoresist pattern 140 as a mask, the bottom hard mask layer 125 is patterned to expose a surface of the upper insulating layer 120.

Referring to FIG. 1F, using the bottom hard mask layer 125 as a mask, the upper insulating layer 120 is etched to expose a surface of the upper etch-stop layer 115. A hole opening 143 is formed in the upper insulating layer 120. The hole opening 143 is narrower than the groove opening 133. Since the upper insulating layer 120 is formed of the same carbon-group material as the photoresist pattern 140, their etching rates are similar to each other. Thus, when the upper insulating layer 120 is etched, the photoresist pattern 140 is removed at the same time.

Referring to FIG. 1G, using the patterned top hard mask layer 130 as a mask, the bottom hard mask layer 125 and the exposed upper etch-stop layer 115 are etched to expose a top surface of the upper insulating layer 120 adjacent to the hole opening 143 and the lower insulating layer 110 under the hole opening 143. When the bottom hard mask layer 125 is patterned using the top hard mask layer 130 as a mask, a facet 147 may be formed. The facet 147 has a sloped profile, which is made by etching the edge of the pattern. In the case where low etch selectivity exists between top and bottom hard mask layers or where the top hard mask layer is relatively thin, the resulting facet 147 is relatively larger. The facet 147 causes a difficulty in isolation between adjacent interconnections in subsequent processes. In order to overcome this difficulty, it is preferable to use materials having a high etch selectivity between the top and bottom hard mask layers or to thickly form the upper hard mask layer. Unfortunately, such materials are rare, and the thick upper hard mask layer worsens the step difference of the pattered hard mask layer (see FIG. 1D). Due to the larger step difference, the resulting photoresist tail becomes a more serious concern. In addition, this larger step difference results in difficulty in removing the upper hard mask layer during subsequent processes.

Referring to FIG. 1H, the exposed upper insulating layer 120 and the exposed lower insulating layer 110 are patterned to form a groove 145 in the upper insulating layer and to form a hole 150 in the lower insulating layer at the same time. The resulting hole 150 is narrower than the groove 145.

Referring to FIG. 1I, the lower etch-stop layer 105 below the via hole 150 is removed to expose a surface of the semiconductor substrate 100. As a result, a damascene pattern is formed. At this time, the upper hard mask layer 130 and the exposed upper etch-stop layer 115 below the groove 145 may also be removed. Although not shown in this figure, the groove 145 and the via hole 150 are filled with a conductive material and planarized to form an interconnection and a via plug. In the case where the distance between grooves is relatively short, a profile having a sharp protrusion 148 is made by the facet, as shown in FIG. 2. During a chemical mechanical polishing (CMP) process performed after a damascene pattern is formed and a conductive layer is deposited, the protrusion 148 impedes the isolation between interconnections and allows for a conductive bridge to be formed therebetween. The CMP process can therefore be performed below target, which results in poor polishing uniformity.

SUMMARY OF THE INVENTION

The present invention is directed to a method of forming a dual damascene interconnection structure while preventing formation of a photoresist tail and a facet. This is accomplished by performing a photolithographic process on a planarization layer without generating a step difference.

In one embodiment, a lower insulating layer, an upper etch-stop layer, an upper insulating layer, a bottom hard mask layer, and a top hard mask layer are sequentially formed on a semiconductor substrate. The top hard mask layer is patterned to form a groove opening exposing a portion of the bottom hard mask layer. A planarization layer is formed in the groove opening and on the patterned top hard mask layer. Using a photoresist pattern, the planarization layer in the groove opening, the bottom hard mask layer, and the upper insulating layer are successively patterned to form a hole opening exposing the upper etch-stop layer. The hole opening is narrower than the groove opening.

A photoresist tail is not formed at the photoresist pattern formed on the planarization layer. The patterned planarization layer is removed. Using the patterned top hard mask layer as a mask, the patterned bottom hard mask layer and the exposed etch-stop layer are etched to expose a top surface of the upper insulating layer and the lower insulating layer. The exposed upper insulating layer and the exposed lower insulating layer are selectively etched to form a groove in the upper insulating layer and simultaneously to form a hole at the lower insulating layer. The hole is narrower than the groove. As a result, a damascene pattern is completely formed.

In another embodiment, an interlayer dielectric and a hard mask layer are sequentially formed on a semiconductor substrate. The interlayer dielectric and the hard mask layer are successively patterned to form a hole exposing a portion of the semiconductor substrate. After forming a planarization layer in the hole and on the hard mask layer, the planarization layer and the hard mask layer are successively patterned to form a groove opening exposing a top surface of the interlayer dielectric. The groove opening is wider than the hole. The groove opening and the hole are adjacent to each other. The exposed interlayer dielectric is etched to form a groove in the interlayer dielectric. A depth of the groove is smaller than a thickness of the interlayer dielectric.

In forming the groove opening, a photoresist pattern having an opening of a width of the groove pattern is formed on the planarization layer. The photoresist pattern is formed on the planarization layer to prevent formation of a photoresist tail. Using the photoresist pattern as a mask, the planarization layer is patterned to expose a surface of the patterned hard mask layer and an upper portion of the hole. The photoresist pattern is removed. Using the patterned planarization layer as a mask, the patterned hard mask layer is selectively etched to expose a top surface of the interlayer dielectric. The patterned planarization layer is then removed.

In an alternative approach for forming the groove opening, a photoresist pattern having an opening of a width of the groove pattern is formed on the planarization layer. The photoresist pattern is formed on the planarization layer to prevent formation of a photoresist tail. Using the photoresist pattern as a mask, the planarization layer and the hard mask layer are successively patterned to expose a top surface of the interlayer dielectric and the hole. The photoresist pattern is then removed.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order not to unnecessarily obscure the present invention.

(First Embodiment)

A first embodiment of the present invention is now described with reference to FIG. 3A through FIG. 3J. The first embodiment is characterized by using a dual hard mask layer.

Figure 1A:
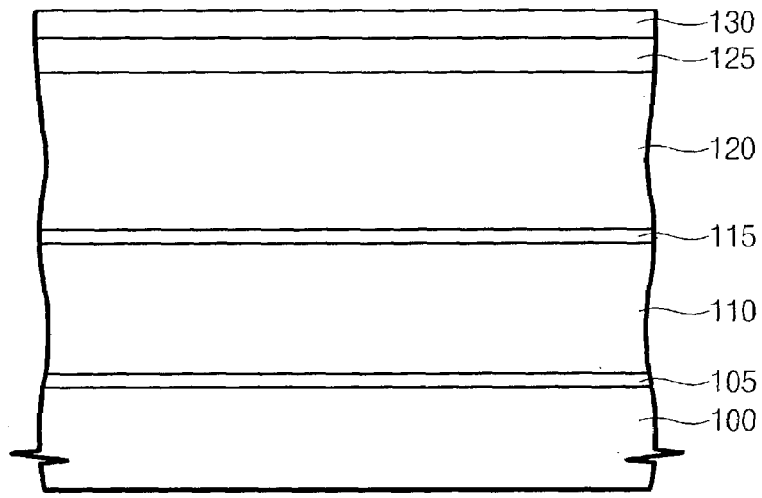
FIG. 1A through FIG. 1I are cross-sectional views illustrating a conventional method of forming a dual damascene pattern using a dual hard mask layer.
Figure 1B:
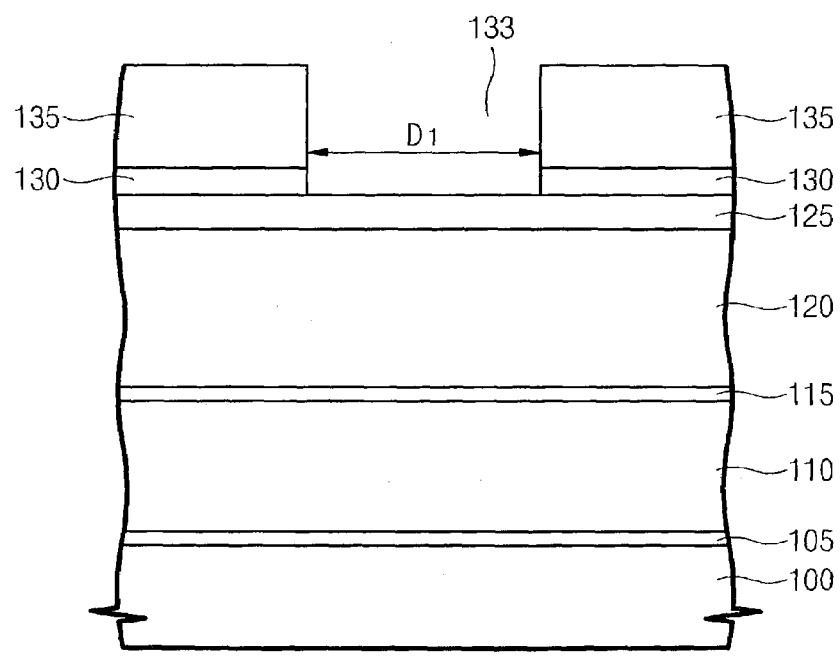
Figure 1C:
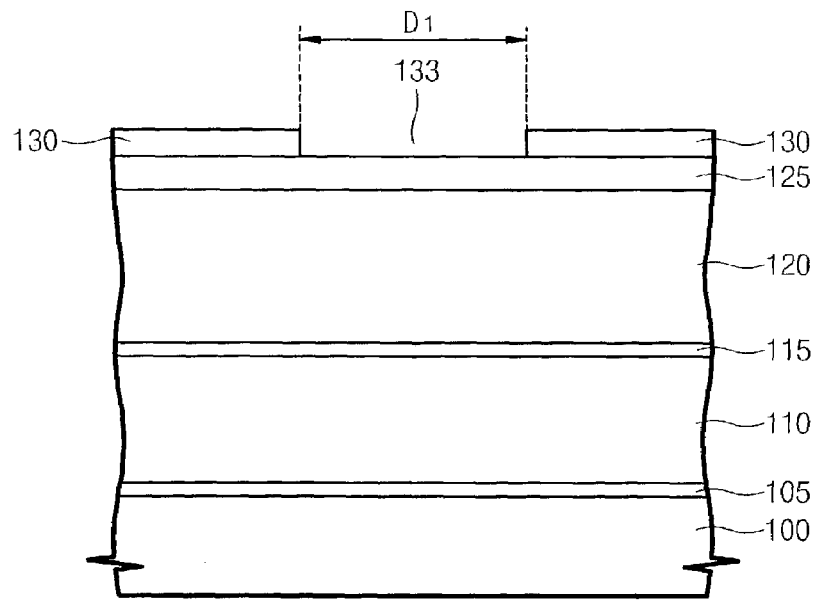
Figure 1D:
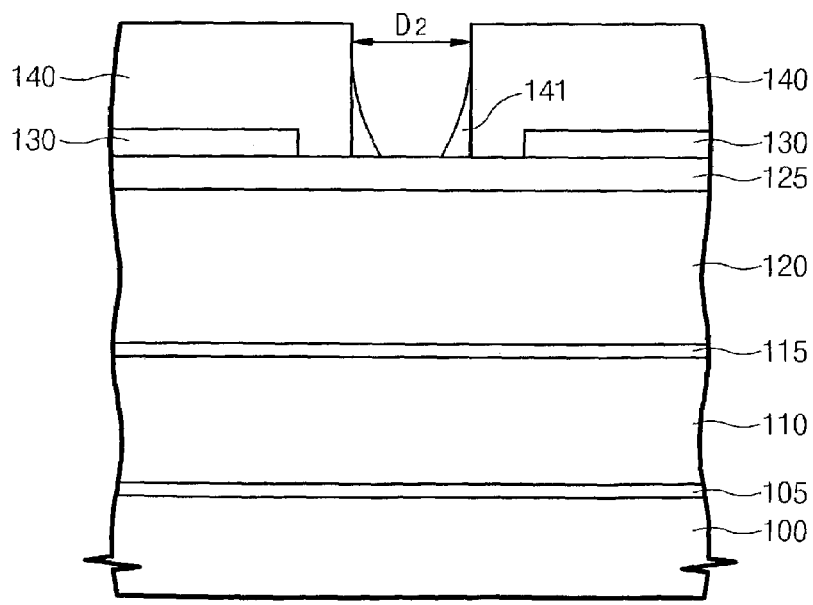
Figure 1E:
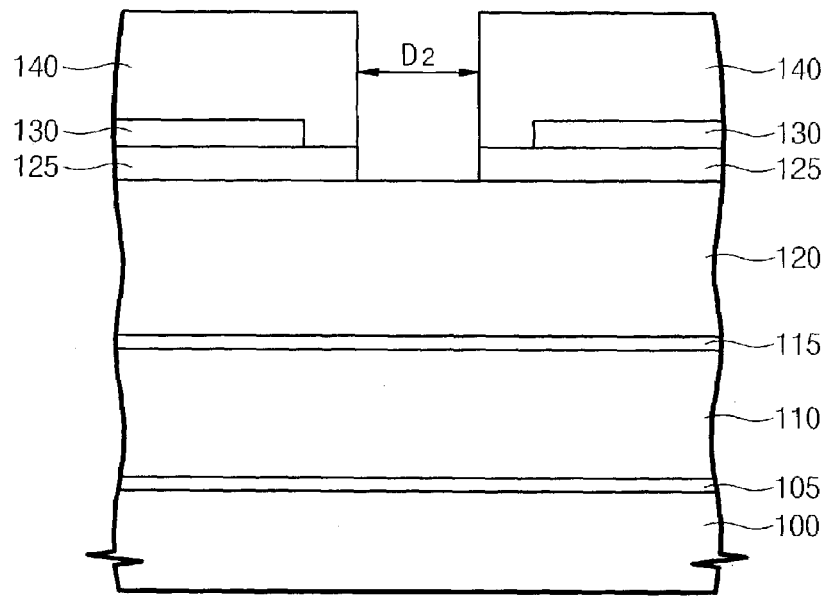
Figure 1F:
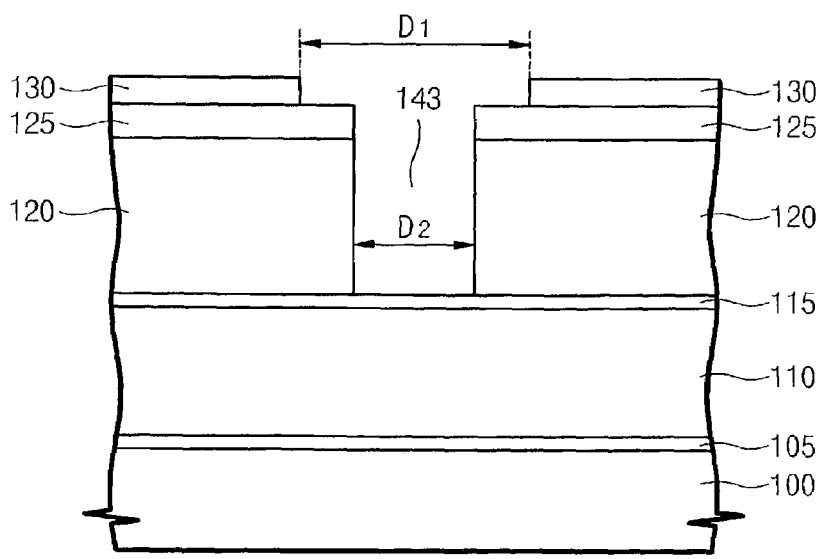
Figure 1G:
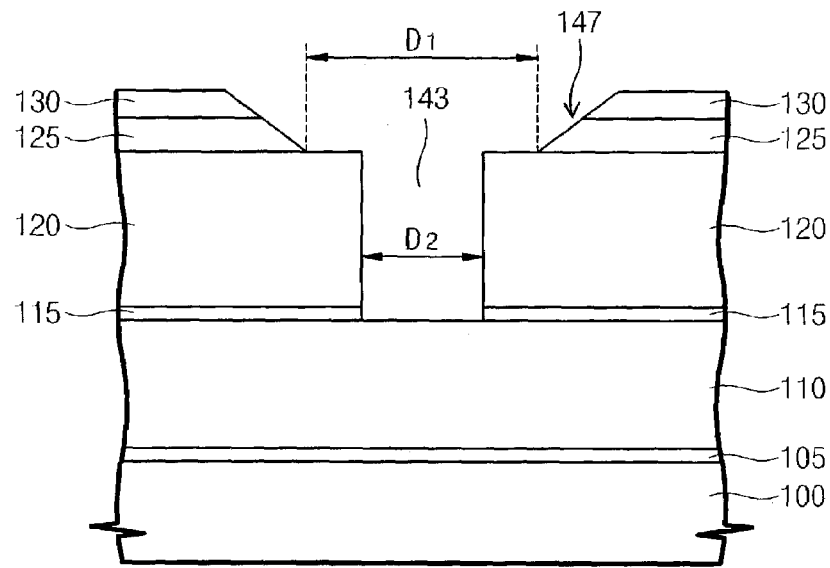
Figure 1H:
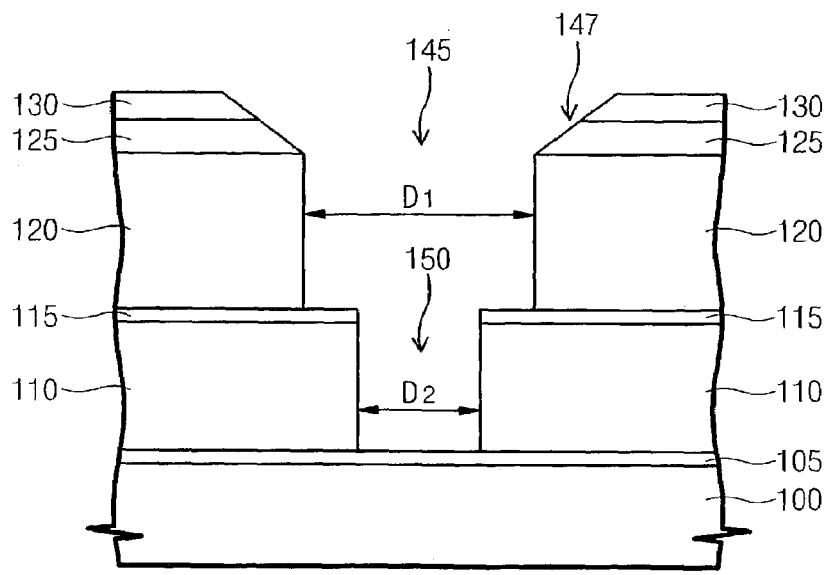
Figure 1I:
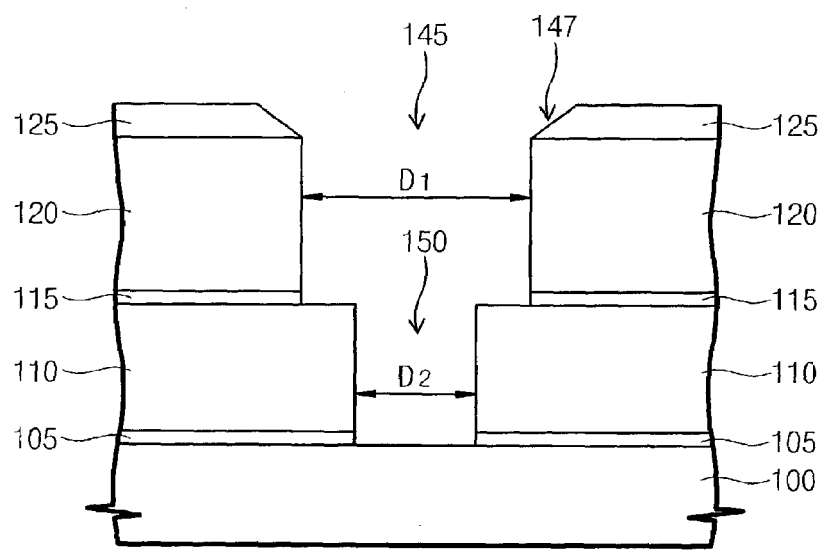
Figure 2:
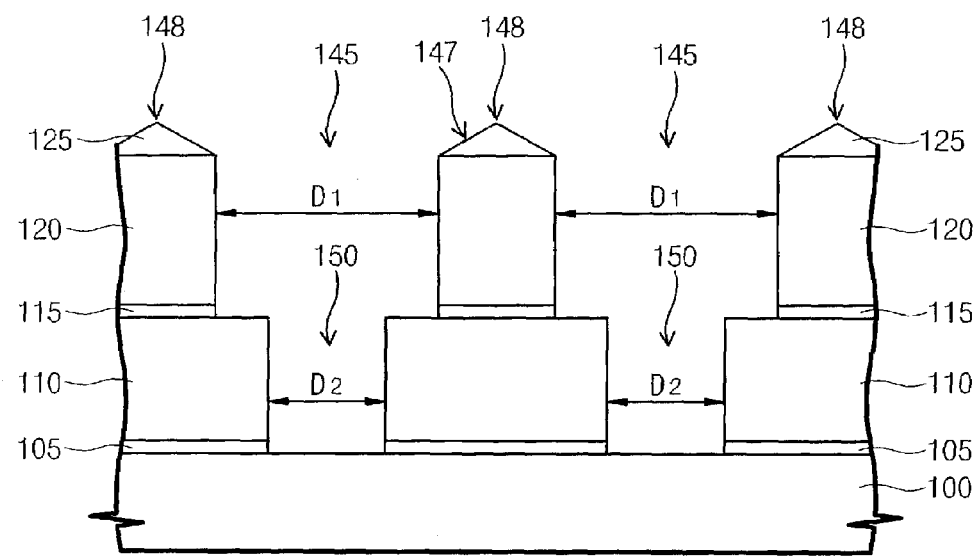
FIG. 2 is a cross-sectional view illustrating the formation of a facet when the dual hard mask layer is used.
Figure 3A:
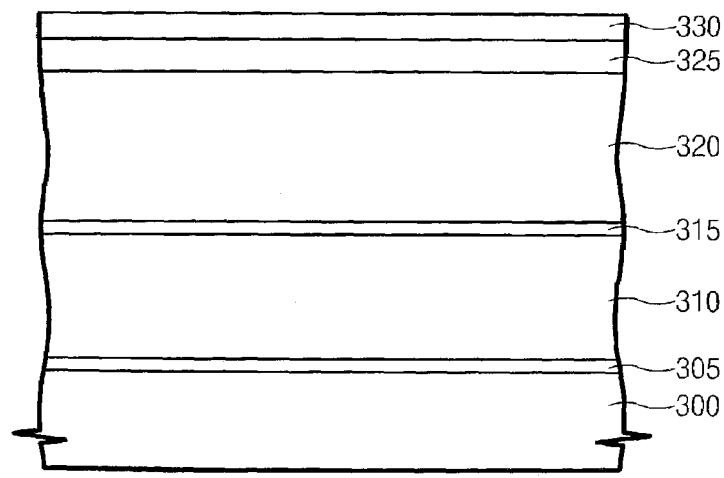
FIG. 3A through FIG. 3J are cross-sectional views illustrating a method of forming a dual damascene interconnection according to a first embodiment of the present invention.

Referring to FIG. 3A, a lower etch-stop layer 305, a lower insulating layer 310, an upper etch-stop layer 315, an upper insulating layer 320, a bottom hard mask layer 325, and a top hard mask layer 330 are sequentially formed on a semiconductor substrate 300.

Each of the upper and lower insulating layers 320 and 310 is relatively thick to allow for later formation of a groove and a via hole therein, (hereinafter, a contact hole is also referred to as a "via hole") and may be formed, for example, of organic polymer having a low-k dielectric constant. Alternatively, each of the upper and lower insulating layers 320 and 310 may be made of fluorine-doped oxide or carbon-doped oxide or silicon oxide. The organic polymer having a low-k dielectric constant includes, for example, polyallylether group resin, polypentafluorostylene, polytetrafluorostylene group resin, annular fluorine resin, siloxane copolymer, polyallylether fluoride group resin, polypentafluorostylene, polytetrafluorostylene group resin, polyimide fluoride resin, polynaphthalene fluoride, and polycide resin. The organic polymer having a low-k dielectric constant may be formed, for example, by means of plasma enhanced chemical vapor deposition (PECVD), high density plasma chemical vapor deposition (HDPCVD), atmospheric pressure chemical vapor deposition (APCVD), spin coating, and so forth.

Each of the top and bottom hard mask layers 330 and 325 may be formed of a material selected from the group consisting of silicon oxide, silicon nitride, silicon carbide (SiC), polysilicon, metal oxide, and metal. Preferably, the etch selectivity of the top hard mask layer 330 is different from that of the bottom hard mask layer 325. For example, if the bottom hard mask layer 325 is formed of silicon oxide ($SiO_2$), the top hard mask layer 330 may be formed of silicon nitride ($Si_3N_4$).

Each of the lower and upper etch-stop layers 305 and 315 may be made of silicon nitride (SiN) or silicon oxynitride (SiON). The lower etch-stop layer 305 may serve both as an etch stop and also to serve as a copper diffusion barrier layer when a copper interconnection is formed on the semiconductor substrate.

Figure 3B:
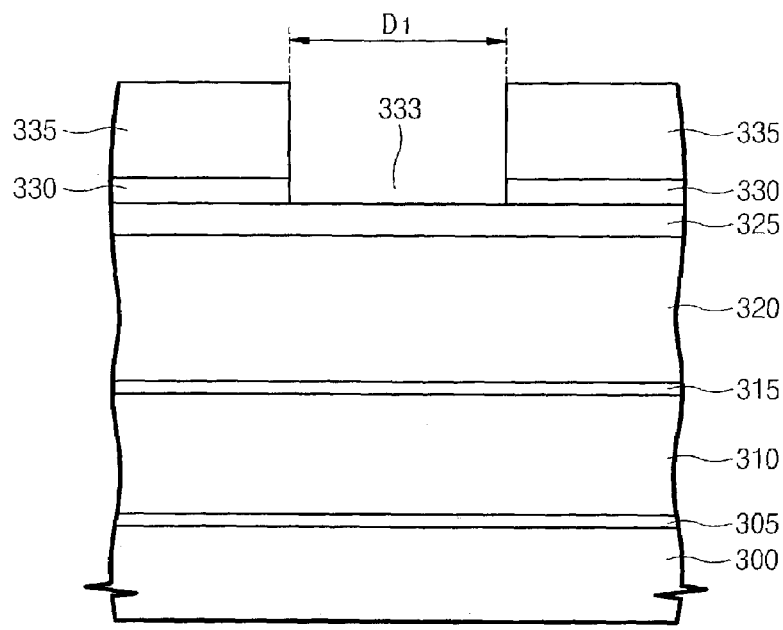

Referring to FIG. 3B, a photoresist pattern 335 having an opening of a groove pattern is formed on the top hard mask layer 330. Using the photoresist pattern 335 as a mask, the top hard mask layer 330 is patterned to form a groove opening 333 exposing a predetermined region of the bottom hard mask layer 325.

Figure 3C:
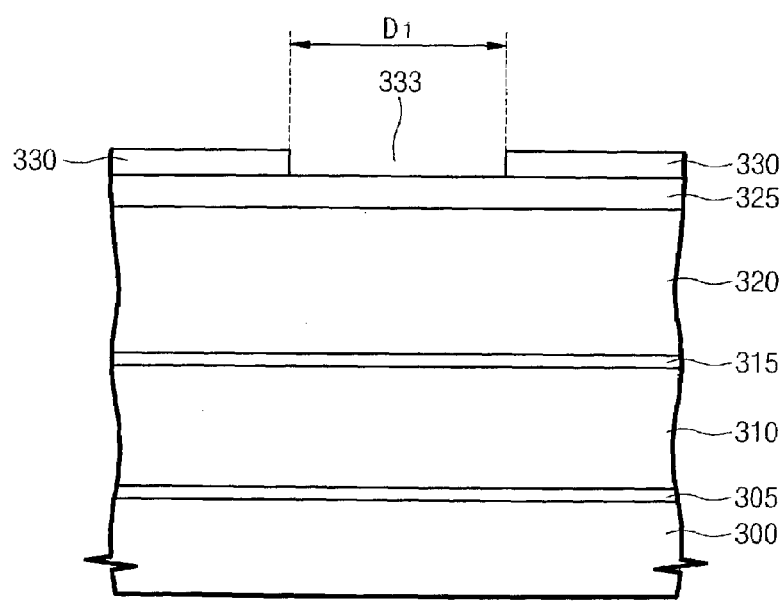

Referring to FIG. 3C, the photoresist pattern 335 is removed by ashing. The groove opening 333 is formed in the top hard mask layer 330.

Figure 3D:
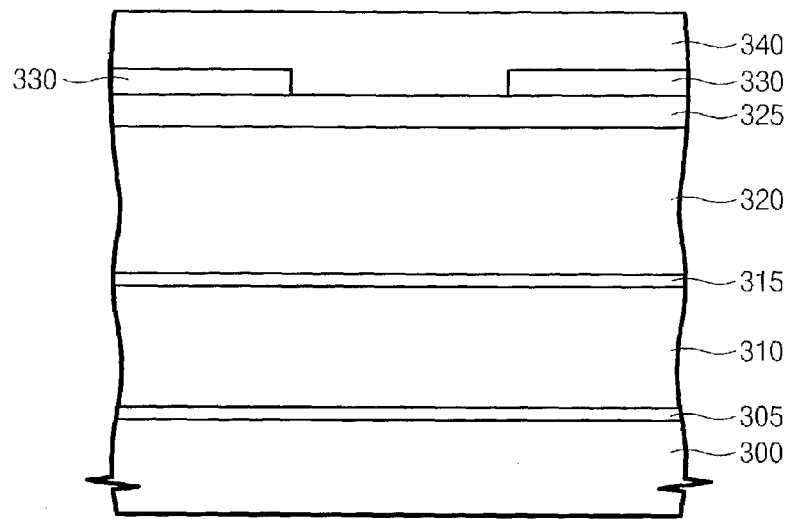

Referring to FIG. 3D, a planarization layer 340 is formed in the groove opening 333 and on the patterned top hard mask layer 330. The planarization layer 340 is formed of a material having a higher etch selectivity than that of the top hard mask layer 330. Further, the planarization layer 340 is preferably formed of a material having a similar etch selectivity to that of the bottom hard mask layer 325. For example, if the bottom hard mask layer 330 is made of silicon nitride ($Si_3N_4$), the planarization layer 340 may be made of a spin on glass (SOG) material such as organic SOG, inorganic SOG, and polysilazane group SOG. The planarization layer 340 is preferably formed of the inorganic SOG.

Figure 3E:
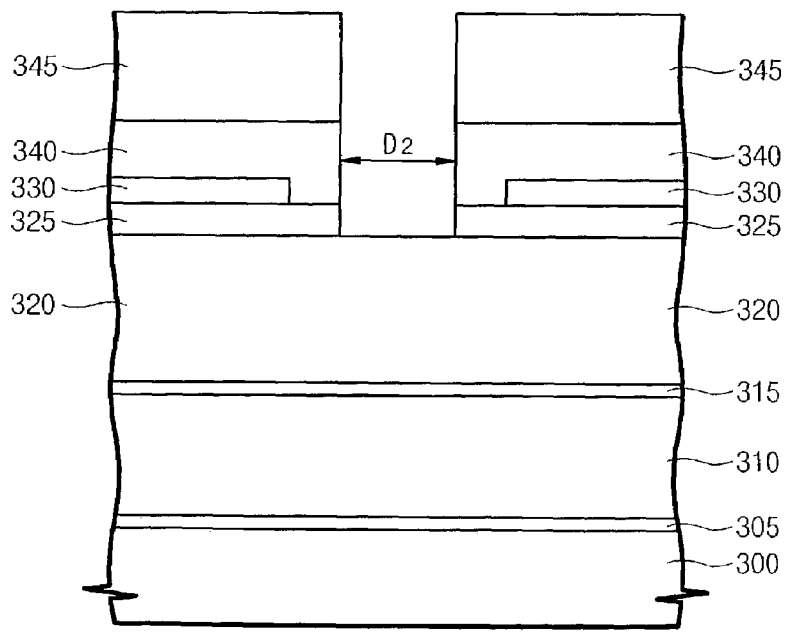

Referring to FIG. 3E, a photoresist pattern 345 having an opening the width of the desired via hole is formed on the planarization layer 340. Unlike the conventional approach, the photoresist pattern 345 is formed on the planarization layer 340 without a step difference in order to prevent formation of a photoresist tail during the photolithographic process. Using the photoresist pattern 345 as a mask, the planarization layer 340 and the bottom hard mask layer 325 in the groove opening 333 are etched to expose a surface of the upper insulating layer 320.

Figure 3F:
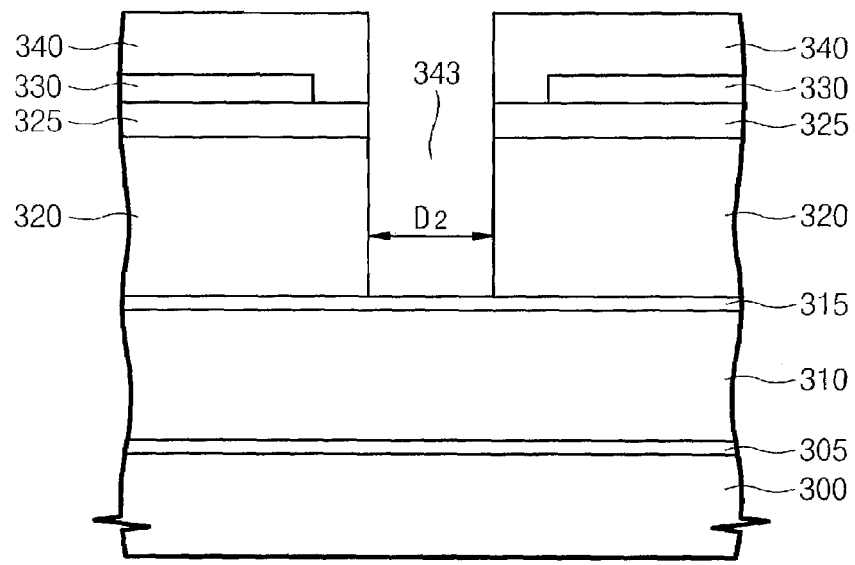

Referring to FIG. 3F, using the planarization layer 340 as a mask, the upper insulating layer 320 is etched down to a top surface of the upper etch-stop layer 315. In a case where the upper insulating layer 320 is made of organic polymer, the photoresist pattern 345 is removed while etching the upper insulating layer because the upper insulating layer 320 is formed of the same carbon group material as the photoresist pattern 345. A hole opening 343 is formed in the upper insulating layer 320. The hole opening 343 is narrower than the groove opening 333.

Figure 3G:
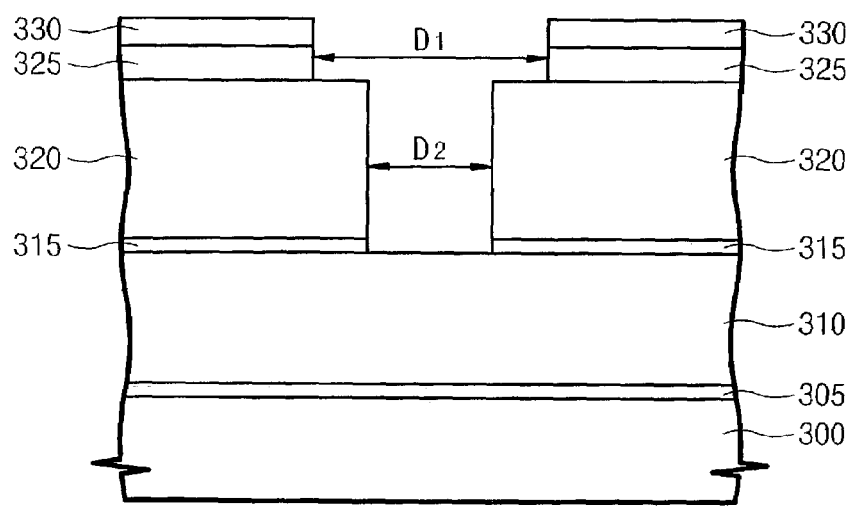

Referring to FIG. 3G, the surface of the semiconductor substrate is etched back to remove the patterned planarization layer 340. Using the patterned top hard mask layer 330 as a mask, the patterned bottom hard mask layer 325 and the exposed upper etch-stop layer 315 are etched to expose a top surface of the upper insulating layer 320 adjacent to the hole opening 343 and the lower insulating layer 310 below the hole opening 343. Preferably, the planarization layer 340 and the bottom hard mask layer 325 are simultaneously removed since their etch selectivities are similar to each other and higher than the etch selectivity of the top hard mask layer 330.

Figure 3H:
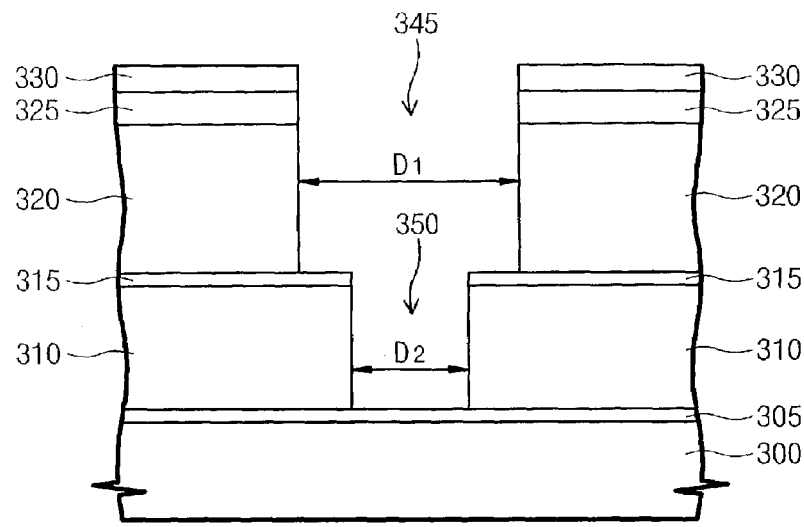

Referring to FIG. 3H, using the top hard mask layer 330 as a mask, the exposed upper insulating layer 320 is selectively etched to expose the upper etch-stop layer 315. At the same time, the lower insulating layer 310 is etched to expose lower etch-stop layer 305. That is, a groove 345 is formed in the upper insulating layer 320 and a via hole 350 is simultaneously formed in the lower insulating layer 310. The via hole 350 is narrower than the groove 345.

Figure 3I:
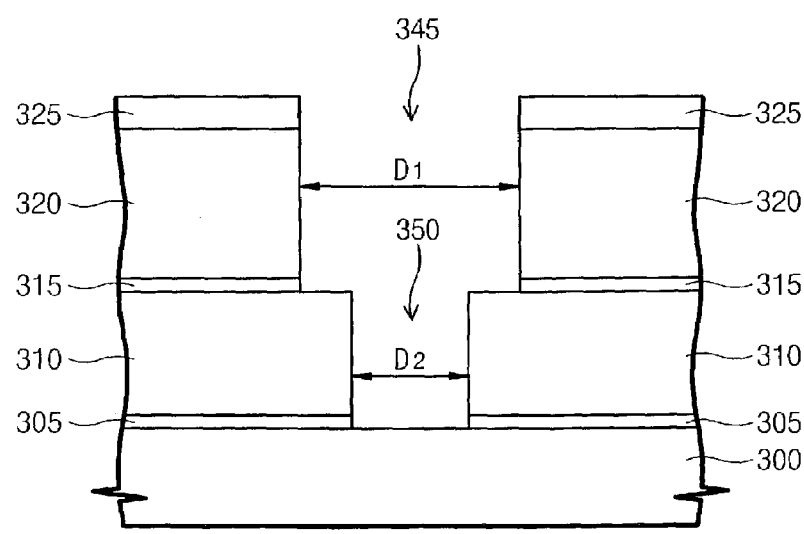

Referring to FIG. 3I, the lower etch-stop layer 305 under the via hole 350 is removed to expose the semiconductor substrate 300. At the same time, the top hard mask layer 330 and the exposed upper etch-stop layer 315 under the groove 345 may be removed.

Figure 3J:
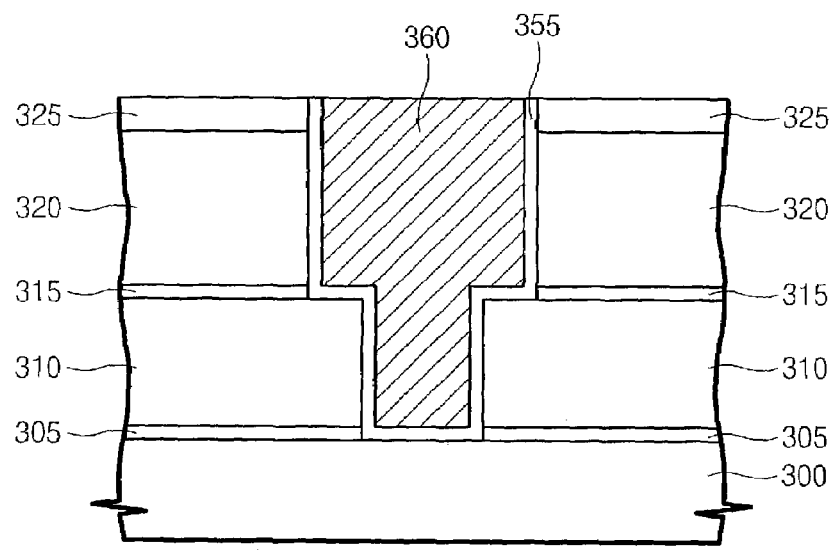

Referring to FIG. 3J, the groove 345 and the via hole 350 are filled with a conductive material 360 and planarized to form an interconnection and a conductive via plug.

The conductive material 360 may be a material selected from the group consisting of aluminum (Al), aluminum alloy (Al-alloy), copper (Cu), gold (Au), silver (Ag), tungsten (W), and molybdenum (Mo). Further, the conductive material 360 may be formed by means of sputtering and reflow or CVD or electroplating. In the case where electroplating is employed, there is a need to form a seed layer enabling current to flow during electrolysis.

Before forming the conductive material 360, a barrier metal layer 355 may be formed. If copper is diffused into the interlayer dielectric, the insulating characteristics thereof may be degraded. The barrier metal layer 355 prevents this from occurring. The barrier metal layer 355 may be formed of at least one material selected from the group consisting of Ta, TaN, TiN, WN, TaC, WC, TiSiN, and TaSiN. Further, the barrier metal layer 355 may be formed by means of physical vapor deposition (PVD) or chemical vapor deposition (CVD) or atomic layer deposition (ALD).

(Second Embodiment)

A second embodiment of the present invention is now described with reference to FIG. 4A through FIG. 4J. In the second embodiment, a single hard mask layer is employed and the interlayer dielectric is formed of organic polymer. Further, the upper groove is formed following formation of the lower via hole.

Figure 4A:
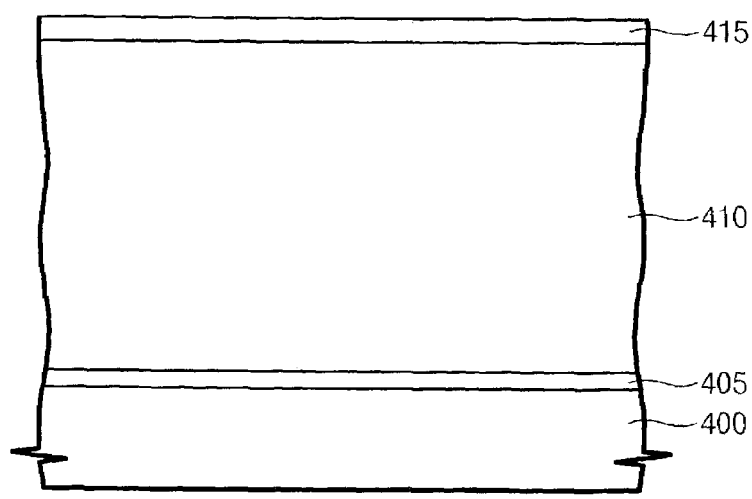
FIG. 4A through FIG. 4J are cross-sectional views illustrating a method of forming a dual damascene interconnection according to a second embodiment of the present invention.

Referring to FIG. 4A, an etch-stop layer 405, an interlayer dielectric 410 and a hard mask layer 415 are formed on a semiconductor substrate 400.

The interlayer dielectric 410 is thick enough to form an upper groove and a lower hole and may be made of organic polymer.

The hard mask layer may be made of a material selected from the group consisting of silicon oxide, silicon nitride, silicon carbide (SiC), polysilicon, metal oxide, and metal.

The etch-stop layer 405 may be made of silicon nitride (SiN) or silicon oxynitride (SiON) material. The etch-stop layer may serve as both an etch stop and as a copper diffusion barrier layer when a copper interconnection is later formed on the semiconductor substrate.

Figure 4B:
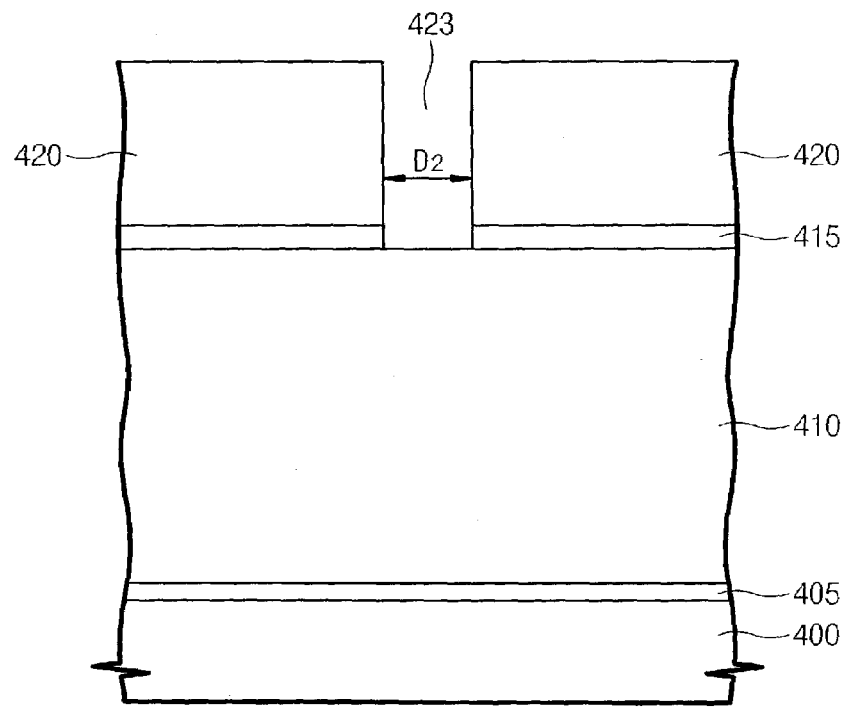

Referring to FIG. 4B, a photoresist pattern 420 having an opening of a width $D_2$ of a later-formed via hole pattern is formed on the hard mask layer 415. Using the photoresist pattern 420 as a mask, the hard mask layer 415 is patterned to form a hole opening 423 exposing a surface of the interlayer dielectric 410.

Figure 4C:
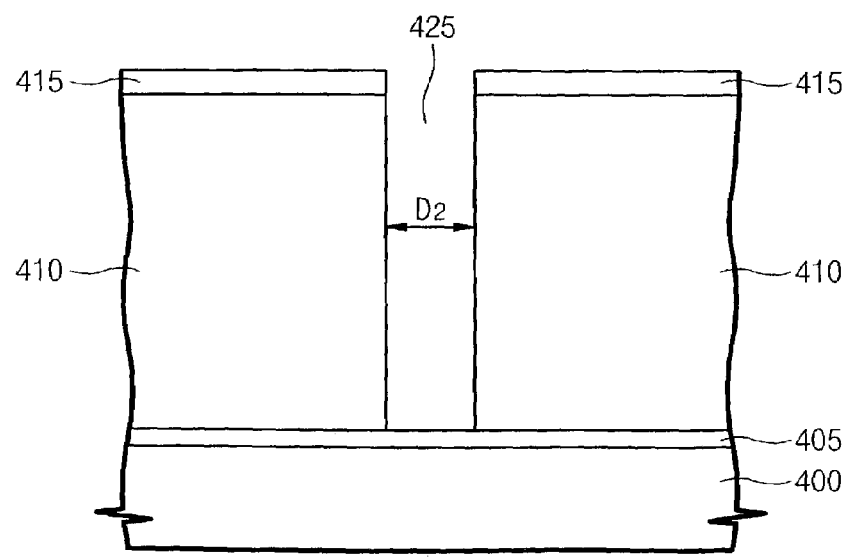

Referring to FIG. 4C, using the hard mask layer 415 as a mask, the interlayer dielectric 410 is patterned to form a via hole 425 exposing a surface of the etch-stop layer 405. In the case where the interlayer dielectric 410 is made of organic polymer, the photoresist pattern 420 is removed while etching the photoresist pattern 420, since the interlayer dielectric 410 is formed of the same carbon group material as the photoresist pattern 420.

Figure 4D:
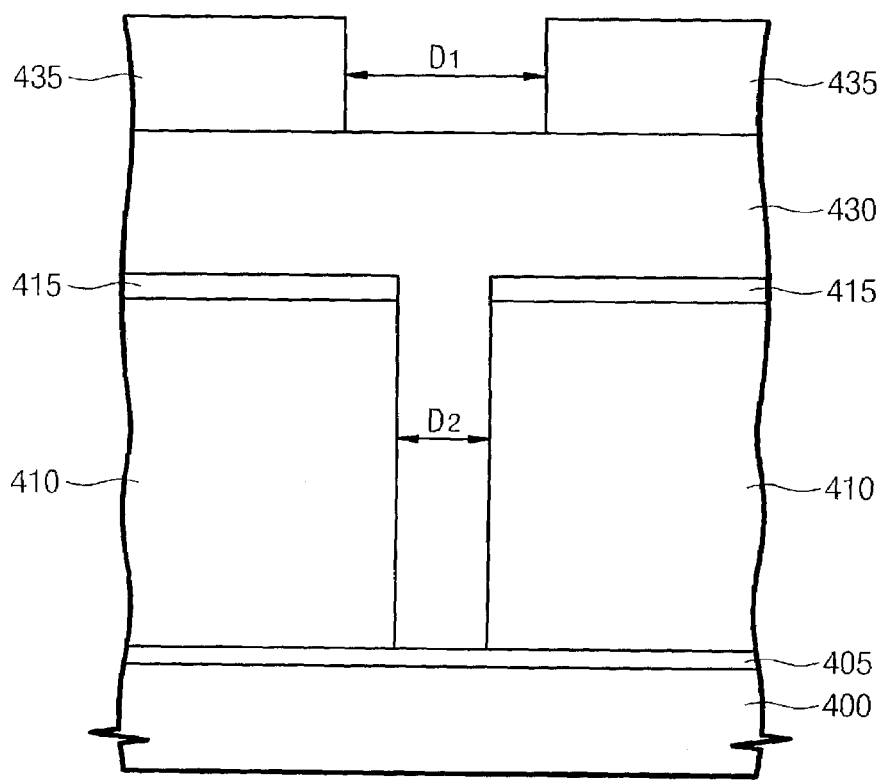

Referring to FIG. 4D, a planarization layer 430 is formed in the via hole 425 and on the hard mask layer 415. The planarization layer 430 is relatively much thicker than the hard mask layer. The planarization layer 430 is made of a material having a high etch selectivity with respect to the interlayer dielectric 410. For example, if the interlayer dielectric is made of organic polymer, the planarization layer 430 may be made of inorganic SOG.

A photoresist pattern 435 having an opening of a width $D_1$ of a groove pattern is formed on the planarization layer 430. The photoresist pattern 435 is formed on the planarization layer 430 without a step difference in order to prevent formation of a photoresist tail, as described above.

Figure 4E:
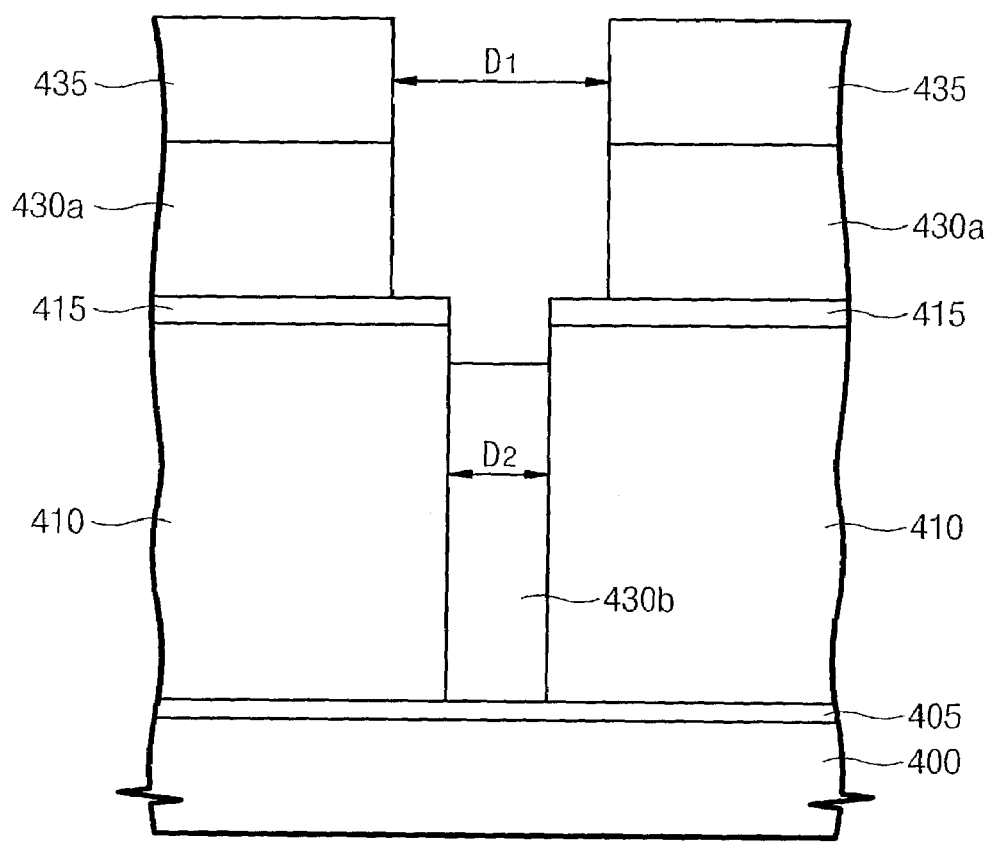

Referring to FIG. 4E, using the photoresist pattern 435 as a mask, the planarization layer 430 is patterned to expose a surface of the patterned hard mask layer 415. Thus, the patterned planarization layer 430a is formed to serve the function of the top hard mask layer of the conventional approach. A remnant 430b of the planarization layer 430 exists in the via hole 425 and is not removed due to the step difference.

Figure 4F:
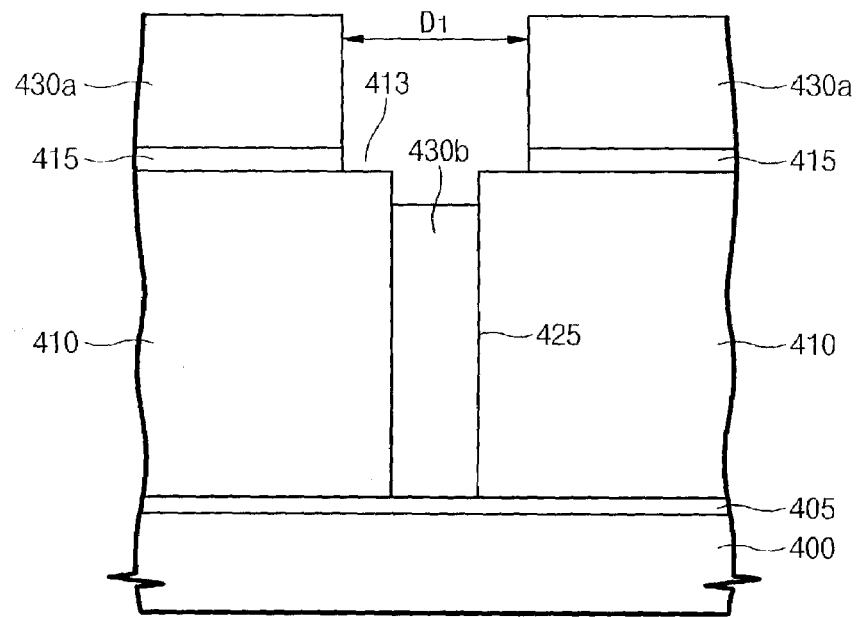

Referring to FIG. 4F, the photoresist pattern 435 is removed. Using the patterned planarization layer 430a as a mask, the hard mask layer 415 is etched down to a top surface of the interlayer dielectric 410 to form a groove opening 413. The patterned planarization layer 430a performs the operation of the top hard mask layer of the conventional approach. The patterned planarization layer 430a is much thicker than the top hard mask layer 415, in order to prevent formation of a facet while etching the hard mask layer 415.

Figure 4G:
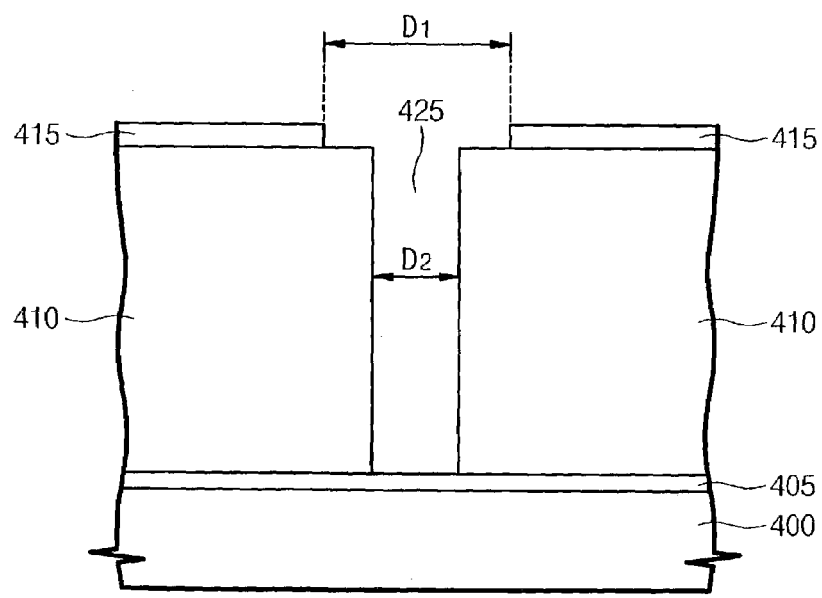

Referring to FIG. 4G, the patterned planarization layer 430a and the remnant of the planarization layer 430b are removed by wet etch. As described above, the patterned planarization layer 430a and remnant 430b are formed of a material having a high etch selectivity with respect to the interlayer dielectric 410, thereby protecting the via hole 425 from pattern damage.

Figure 4H:
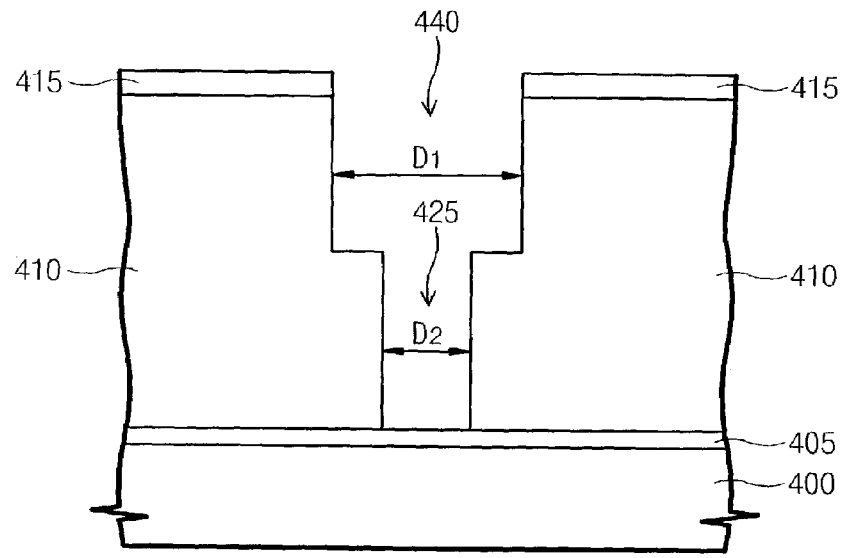

Referring to FIG. 4H, using the patterned hard mask layer 415 as a mask, an upper portion of the interlayer dielectric 410 is etched to form a groove 440. The via hole 425 is formed below the interlayer dielectric 410.

Figure 4I:
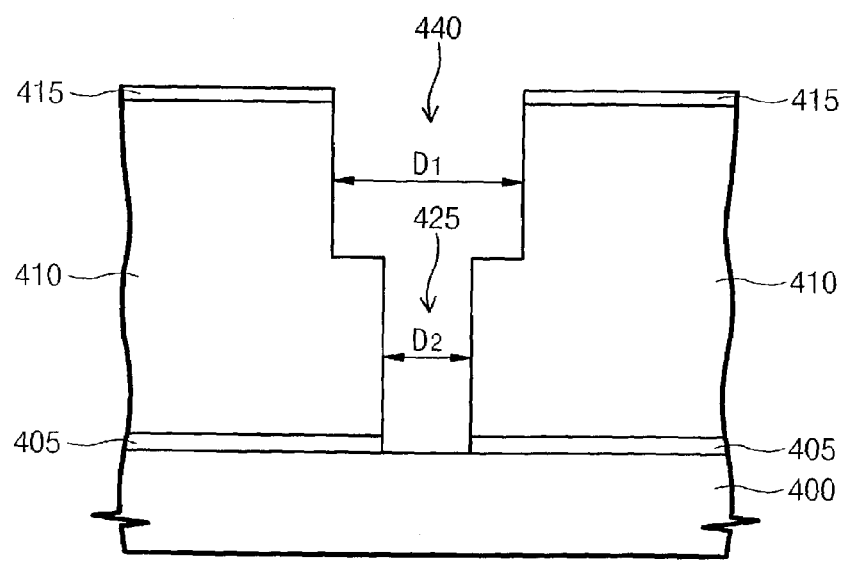

Referring to FIG. 4I, the etch-stop layer 405 disposed below the via hole 425 is removed to expose the semiconductor substrate 400. At this time, the hard mask layer 415 disposed over the interlayer dielectric 410 may be partially removed.

Figure 4J:
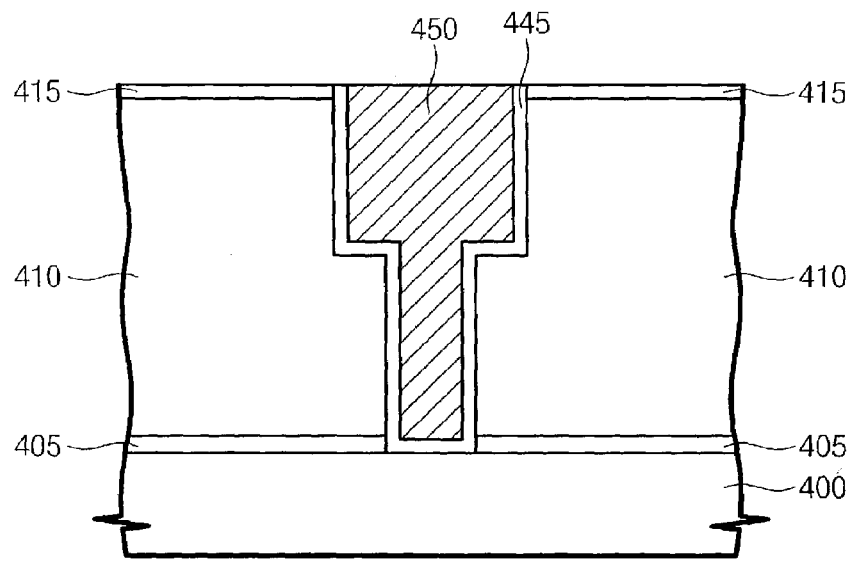

Referring to FIG. 4J, the groove 440 and the via hole 425 are filled with a conductive material 450 and planarized to form an interconnection and a via plug.

The conductive material 450 may be made of a material selected from the group consisting of aluminum (Al), aluminum alloy (Al-alloy), copper (Cu), gold (Au), silver (Ag), tungsten (W), and molybdenum (Mo). Further, the conductive material 450 may be made by means of sputtering and reflow or CVD or electroplating. In a case where the electroplating is employed, there is a need to form a seed layer enabling a current to flow during electrolysis.

Before forming the conductive material 450, a barrier metal layer 445 may be formed. If copper is diffused into the interlayer dielectric, the insulating characteristics thereof may be degraded. The barrier metal layer 445 prevents this from occurring. The barrier metal layer 445 may be formed of at least one material selected from the group consisting of Ta, TaN, TiN, WN, TaC, WC, TiSiN, and TaSiN. Further, the barrier metal layer 455 may be formed by means of physical vapor deposition (PVD) or chemical vapor deposition (CVD) or atomic layer deposition (ALD).

(Third Embodiment)

A third embodiment of the present invention is now described with reference to FIG. 5A through FIG. 5I. The steps of FIG. 5A through FIG. 5C are identical with those of the second embodiment and will be explained in brief.

A difference between the third and second embodiments lies in the etching mask that is used when the groove is formed. That is, a planarization layer is removed (FIG. 4G) and a hard mask layer is used an etching mask (FIG. 4H) in the second embodiment, while the groove pattern is formed in an interlayer dielectric by using the planarization layer as an etching mask in the third embodiment.

Figure 5A:
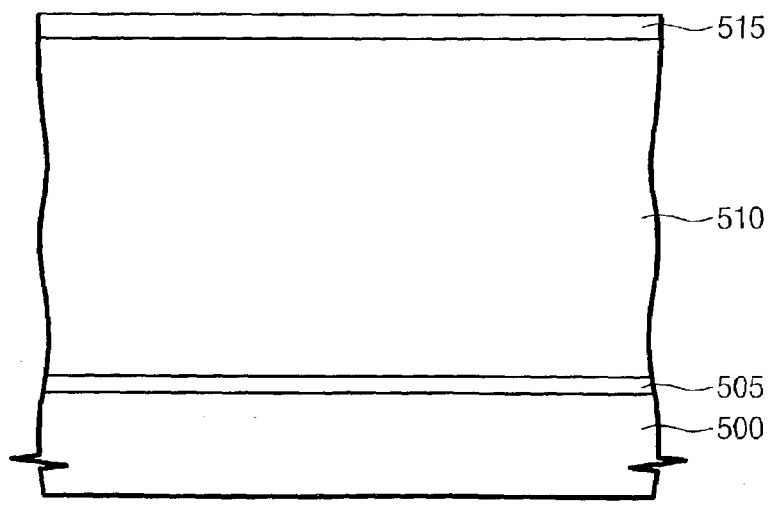
FIG. 5A through FIG. 5I are cross-sectional views illustrating a method of forming a dual darnascene interconnection according to a third embodiment of the present invention.

Referring to FIG. 5A, an etch-stop layer 505, an interlayer dielectric 510, and a hard mask layer 515 are formed on a semiconductor substrate 500.

Figure 5B:
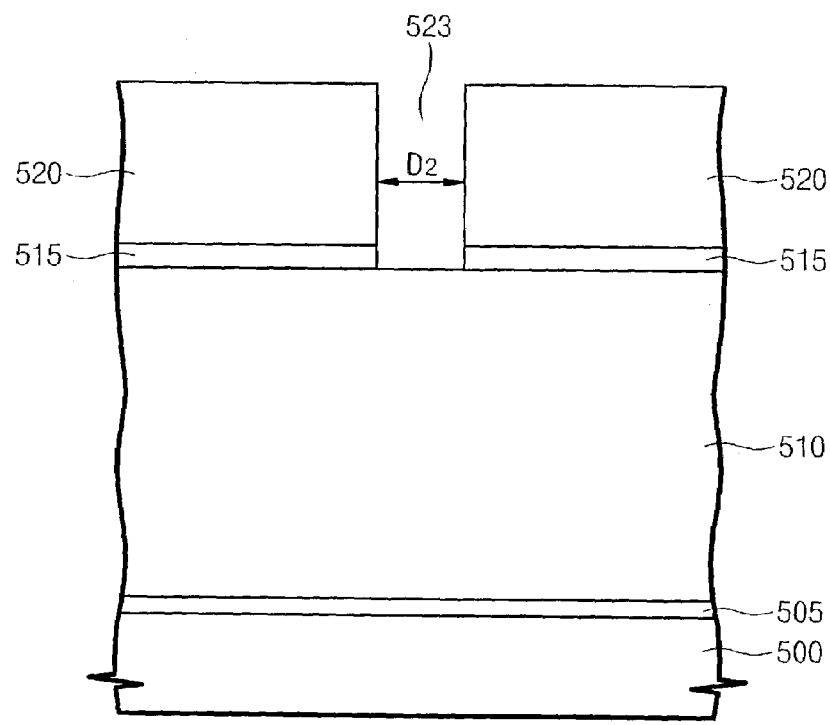
Figure 5C:
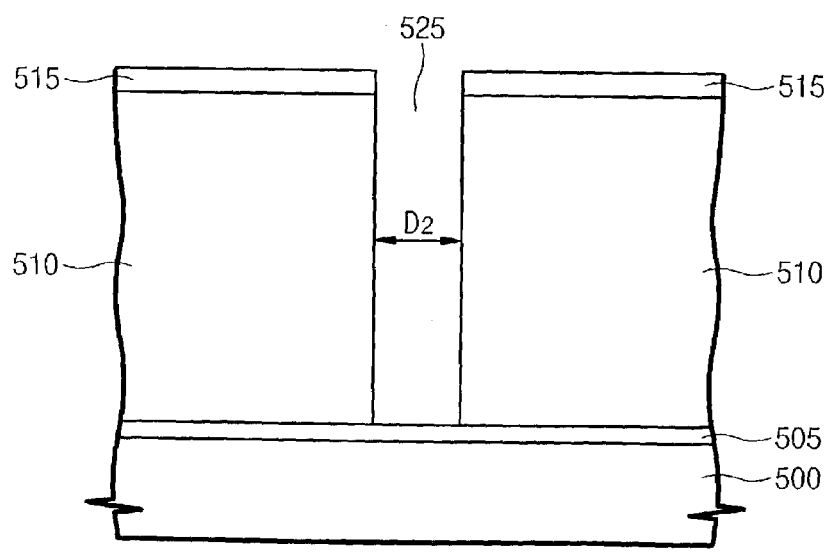

Referring to FIG. 5B, a photoresist pattern 520 having an opening of width $D_2$ of a via hole pattern is formed on the hard mask layer 515. Using the photoresist pattern 520 as a mask, the hard mask layer 515 is patterned to form a hole opening 523 exposing a surface of the interlayer dielectric 510.

Referring to FIG. 5C, using the photoresist pattern 520 and the hard mask layer 515 as a mask, the interlayer dielectric 510 is selectively etched to expose a surface of the etch-stop layer 505. In a case where the interlayer dielectric 510 is made of organic polymer, the photoresist pattern 520 is removed while etching the interlayer dielectric 510, assuming the organic is polymer is in the carbon group. A via hole 525 is formed in the interlayer dielectric 510.

Figure 5D:
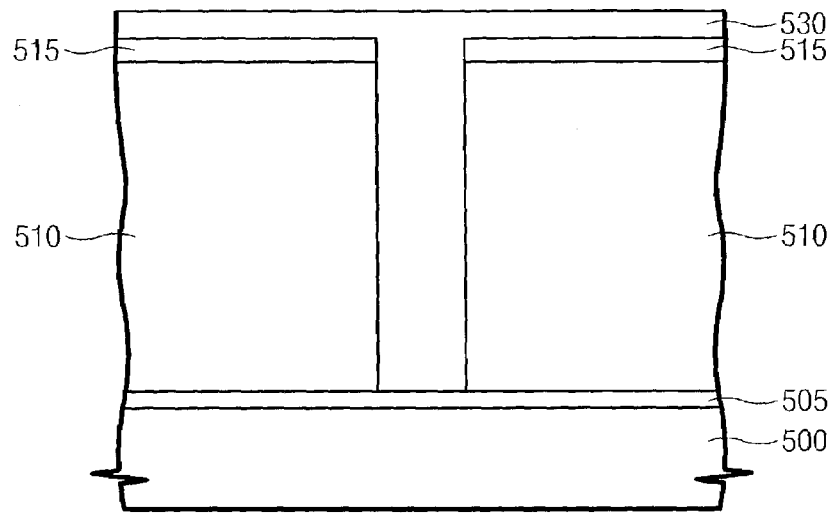

Referring to FIG. 5D, a planarization layer 530 is formed in the via hole 525 and on the patterned hard mask layer 515. The planarization layer 530 of the third embodiment is thinner than that of the second embodiment.

Figure 5E:
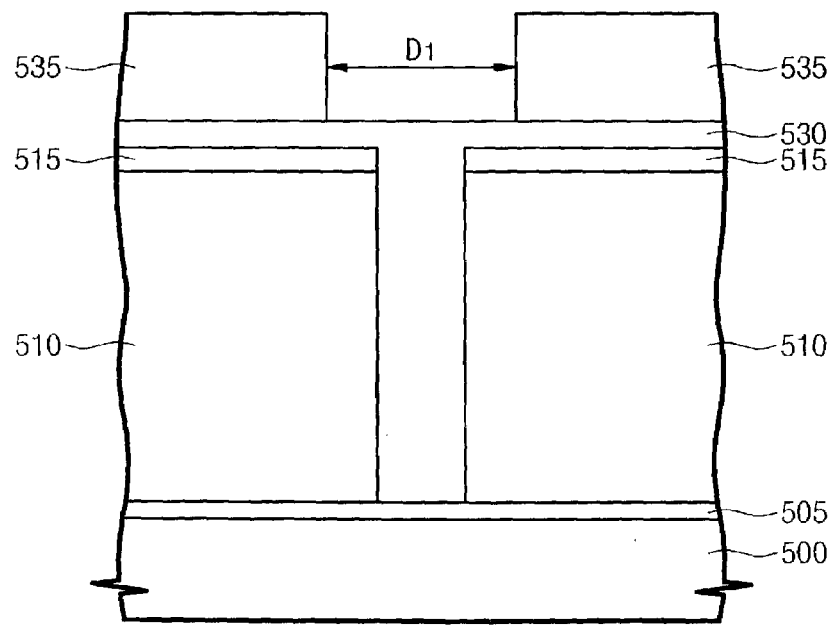

Referring to FIG. 5E, a photoresist pattern 535 having an opening of a groove width is formed on the planarization layer 530. The opening has the same width as the groove pattern. The photoresist pattern 535 is formed on the planarization layer 530 without a step difference, in order to prevent formation of a photoresist tail during a photolithographic process, as described above.

Figure 5F:
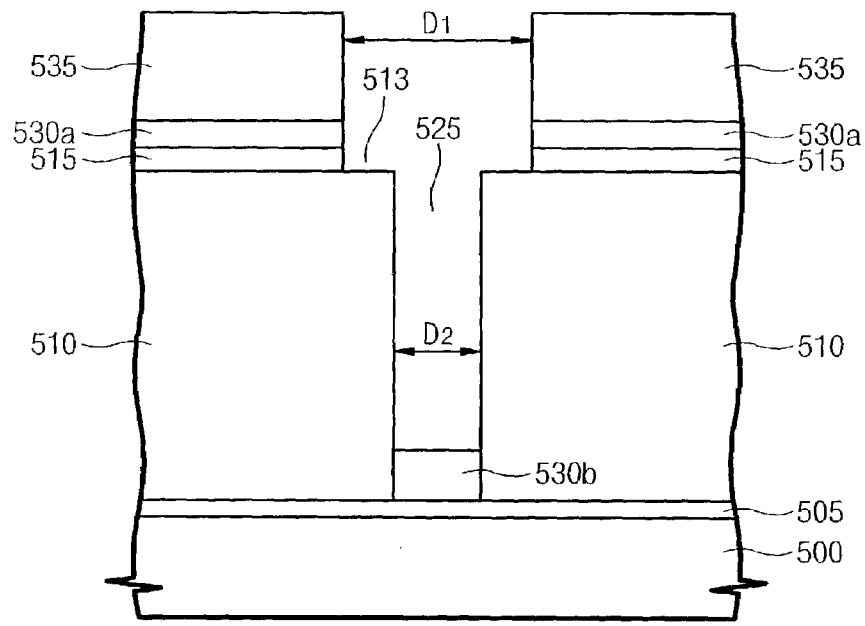

Referring to FIG. 5F, using the photoresist pattern 535 as a mask, the planarization layer 530 and the hard mask layer 515 are selectively etched to form a groove opening 513 exposing a top surface of the interlayer dielectric 510. The planarization layer 530 is thereby patterned 530a and operates as a conventional upper hard mask layer. A remnant of the planarization layer 530 remains in the via hole 525. As compared to the conventional approach, the hard mask layer 515 is patterned by means of the photoresist pattern 535 to prevent formation of a facet. Unlike the second embodiment, the planarization layer 530 and the hard mask layer 515 are etched at the same time.

Figure 5G:
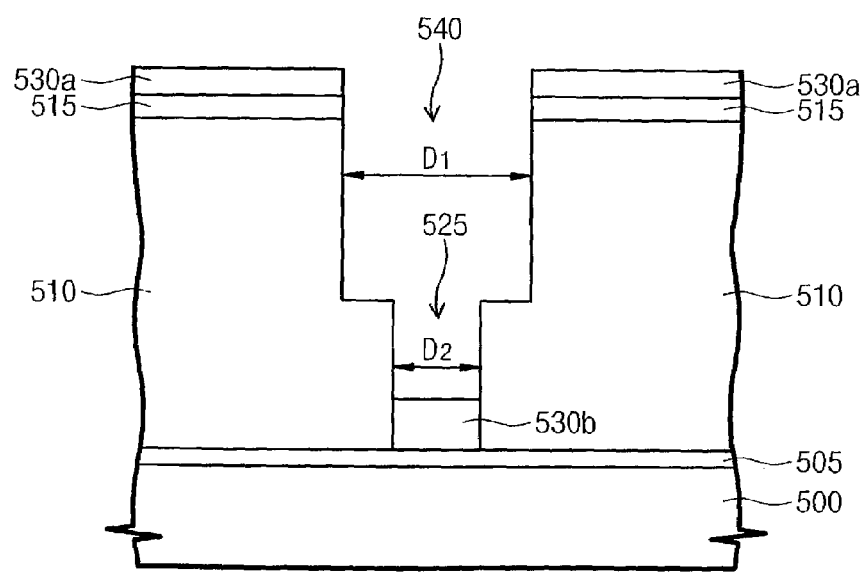

Referring to FIG. 5G, using the photoresist pattern 535 and the patterned planarization layer 530a as a mask, an upper portion of the interlayer dielectric 510 is etched to form a groove 540. In the case where the interlayer dielectric 510 is made of organic polymer, the photoresist pattern 535 is removed while etching the interlayer dielectric 510 since the interlayer dielectric 510 is preferably made of the same carbon group material as the photoresist pattern 535.

Figure 5H:
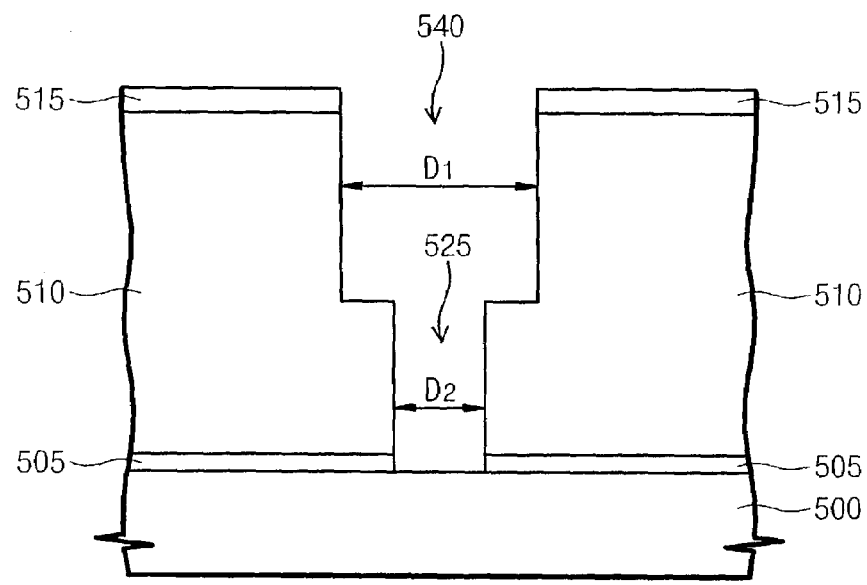

Referring to FIG. 5H, the remnant 530b of the planarization layer 530 and the etch-stop layer 505 are removed to expose a surface of the semiconductor substrate 500. At this time, the patterned hard mask layer 515 can also be at least partially removed.

Figure 5I:
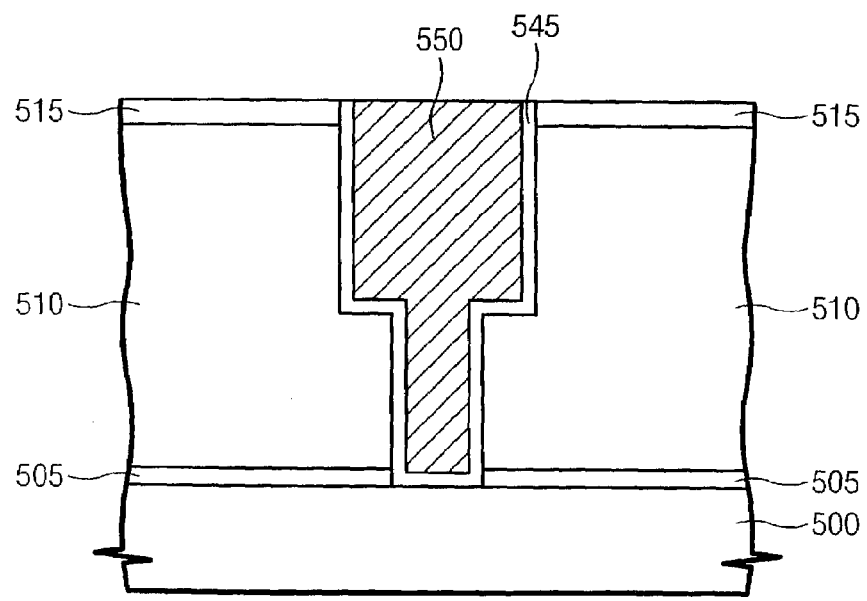

Referring to FIG. 5I, the groove 540 and the via hole 525 are filled with a conductive material 550 and planarized to form an interconnection and a via plug. Preferably, a barrier metal layer 545 is formed before the conductive material 550 is formed. The conductive material 550 and the barrier metal layer 545 are formed in the same manner as described above in the second embodiment.

While the present invention has been particularly shown and described with reference to preferred embodiments thereof, it will be understood by those skilled in the art that various changes in form and details may be made therein without departing from the spirit and scope of the invention.

What is claimed is:

1. A method of forming a damascene interconnection, comprising:
    (a) sequentially forming an interlayer dielectric and a hard mask layer on a semiconductor substrate;
    (b) successively patterning the hard mask layer and the interlayer dielectric to form a hole exposing a predetermined portion of the semiconductor substrate;
    (c) forming a planarization layer in the hole and on the hard mask layer, the planarization layer having a planar top surface extending across the hole;
    (d) patterning the planarization layer and the hard mask layer to form a groove opening, wherein the groove opening is wider than the hole and exposes a top surface of the interlayer dielectric adjacent to the hole; and
    (e) etching the exposed interlayer dielectric to form a groove in the interlayer dielectric, wherein the patterned planarization layer is removed before etching the exposed interlayer dielectric and wherein the groove is wider than the hole and a depth of the groove is smaller than a thickness of the interlayer dielectric.

2. The method as claimed in claim 1, wherein the interlayer dielectric comprises an organic polymer having a low dielectric constant.

3. The method as claimed in claim 1, wherein the planarization layer comprises spin on glass (SOG).

4. The method as claimed in claim 1, wherein step (d) comprises:
    forming a photoresist pattern having an opening of a width of the groove pattern on the planarization layer;
    using the photoresist pattern as a mask, patterning the planarization layer to expose a surface of the patterned hard mask layer;
    removing the photoresist pattern;
    using the patterned planarization layer as a mask, selectively etching the patterned hard mask layer to expose a top surface of the interlayer dielectric; and
    removing the patterned planarization layer.

5. The method as claimed in claim 1, wherein step (b) comprises:
    forming a photoresist pattern having an opening of a width of the hole on the hard mask layer;
    patterning the hard mask layer by using the photoresist pattern as an etch mask; and
    etching the interlayer dielectric by using the hard mask layer as the etch mask to form a hole, wherein the photoresist pattern is removed while the interlayer dielectric is etched.

6. The method as claimed in claim 1, further comprising:
    forming an etch-stop layer on the semiconductor substrate; and
    removing the etch-stop layer after the hole is formed.

7. The method as claimed in claim 1, wherein the interlayer dielectric and the planarization layer comprise materials having high etch selectivities with respect to each other.

8. The method as claimed in claim 1, wherein the hard mask layer comprises at least one material selected from the group consisting of silicon oxide, silicon nitride, carbon suicide (SiC), polysilicon, metal oxide materials, and metal.

9. The method as claimed in claim 1, further comprising forming a conductive material in the hole and the groove and planarizing the conductive material to form an interconnection and a via plug.

10. The method as claimed in claim 9, further comprising forming a barrier metal layer before the conductive material is formed.

11. The method as claimed in claim 9, wherein the conductive material comprises at least one material selected from the group consisting of aluminum (Al), aluminum alloy (Al-alloy), copper (Cu), gold (Au), tungsten (W), and molybdenum (Mo).

12. A method of forming a damascene interconnection, comprising:
    (a) sequentially forming an interlayer dielectric and a hard mask layer on a semiconductor substrate;
    (b) successively patterning the hard mask layer and the interlayer dielectric to form a hole exposing a predetermined portion of the semiconductor substrate;
    (c) forming a planarization layer comprising spin on glass (SOG) in the hole and on the hard mask layer;
    (d) patterning the planarization layer and the hard mask layer to form a groove opening, wherein the groove opening is wider than the hole and exposes a top surface of the interlayer dielectric adjacent to the hole; and
    (e) etching the exposed interlayer dielectric to form a groove in the interlayer dielectric, wherein the patterned planarization layer is removed before etching the exposed interlayer dielectric and wherein the groove is wider than the hole and a depth of the groove is smaller than a thickness of the interlayer dielectric.

* * * * *

UNITED STATES PATENT AND TRADEMARK OFFICE
CERTIFICATE OF CORRECTION

| | | |
|---|---|---|
| PATENT NO. | : 7,022,600 B2 | Page 1 of 1 |
| APPLICATION NO. | : 10/437806 | |
| DATED | : April 4, 2006 | |
| INVENTOR(S) | : Jae-Hak Kim et al. | |

It is certified that error appears in the above-identified patent and that said Letters Patent is hereby corrected as shown below:

Column 10, Claim 8, Line 31, delete "suicide" and insert --silicide--.

Signed and Sealed this

Twenty-fifth Day of July, 2006

JON W. DUDAS
*Director of the United States Patent and Trademark Office*